US006249181B1

(12) United States Patent
Marble

(10) Patent No.: US 6,249,181 B1
(45) Date of Patent: Jun. 19, 2001

(54) DIFFERENTIAL-MODE CHARGE TRANSFER AMPLIFIER

(76) Inventor: William J. Marble, 223 W. 2230 North, #13, Provo, UT (US) 84604

( * ) Notice: Subject to any disclaimer, the term of this patent is extended or adjusted under 35 U.S.C. 154(b) by 0 days.

(21) Appl. No.: 09/451,562

(22) Filed: Nov. 30, 1999

(51) Int. Cl.[7] ....................................................... H03F 1/02
(52) U.S. Cl. .............................. 330/9; 330/258; 327/124; 327/554
(58) Field of Search ........................ 330/9, 258; 327/124, 327/307, 554, 77, 81, 88, 89, 94, 96, 91

(56) References Cited

U.S. PATENT DOCUMENTS

| | | | | |
|---|---|---|---|---|
| 5,724,000 | * | 3/1998 | Quinn ..................................... | 327/554 |
| 5,736,895 | * | 4/1998 | Yu et al. ................................ | 327/554 |
| 5,739,720 | * | 4/1998 | Lee ......................................... | 330/9 |
| 6,150,851 | * | 11/2000 | Ohmi et al. ............................ | 327/91 |

OTHER PUBLICATIONS

Brandt, Brian P., et al. "A 75–mW, 10–b, 20–MSPS CMOS Subranging ADC with 9.5 Effective Bits at Nyquist" *IEEE Journal of Solid–State Circuits,* vol. 34, No. 12, Dec. 1999, pp. 1788–17953.

Chang, Dong–Young, et al. "Design Techniques for a Low–Power Low–Cost CMOS A/D Converter" *IEEE Journal of Solid–State Circuits,* vol. 33, No. 8, Aug. 1998, pp. 1244–1248.

Cusinato, P., et al. "Analysis of the Behavior of a Dynamic Latch Comparator" *IEEE Transactions on Circuits and Systems—I: Fundamental Theory and Applications,* vol. 45, No. 3, Mar. 1998, pp. 294–298.

Dingwall, Adrew G. F., et al. "An 8–MHz CMOS Subranging 8–Bit A/D Converter" *IEEE Journal of Solid–State Circuits,* vol. SC–20, No. 6, Dec. 1985, pp. 1138–1143.

Ito, Masao, et al. "A 10 bit 20 MS/s 3 V Supply CMOS A/D Converter" *IEEE Journal of Solid–State Circuits,* vol. 29, No. 12, Dec. 1994, pp. 1531–1536.

Kawashima, Shoichiro, et al. "A Charge–Transfer Amplifier and an Encoded–Bus Architecture for Low–Power SRAM's" *IEEE Journal of Solid–State Circuits,* vol. 33, No. 5, May 1998, pp. 793–799.

Kotani, Koji, et al. "CMOS Charge–Transfer Preamplifier for Offset–Fluctuation Cancellation in Low–Power A/D Converters" *IEEE Journal of Solid–State Circuits,* vol. 33, No. 5, May 1998, pp. 762–768.

Kotani, Koji, et al. "CMOS Charge–Transfer Preamplifier for Offset–Fluctuation Cancellation in Low–Power, High–Accuracy Comparators" 1997 Symposium on VLSI Circuits Digest of Technical Papers, pp. 21–22.

(List continued on next page.)

*Primary Examiner*—Robert Pascal
*Assistant Examiner*—Henry Choe

(57) ABSTRACT

A differential-mode charge transfer amplifier receives a differential input voltage and produces a proportional differential output voltage. The amplifier includes two CMOS charge transfer amplifiers. The two CMOS charge transfer amplifier share two charge transfer capacitors such that the CMOS charge transfer amplifiers are mirrored about the capacitors. The positive charge transfer capacitor terminal (i.e., the terminal that is precharged to a high voltage) of one CMOS charge transfer amplifier is capacitively coupled to the negative charge transfer capacitor terminal (i.e., the terminal that is precharged to a low voltage) of the other CMOS charge transfer amplifier. In addition, the negative charge transfer capacitor terminal of one CMOS charge transfer amplifier is capacitively coupled to the positive terminal of the other CMOS charge transfer amplifier. The amplifier has a significantly increased common-mode rejection, significantly reduced voltage amplification error, and an increased linearity range.

14 Claims, 6 Drawing Sheets

OTHER PUBLICATIONS

Kotani, Koji, et al. "Feedback Charge–Transfer Comparator with Zero Static Power" *IEEE International Solid State Circuits Conference*, Feb. 1999, pp. 328–329.

Kusumoto, Keiichi, et al. "A 10–b 20–MHz 30–mW Pipelined Interpolating CMOS ADC" *IEEE Journal of Solid–State Circuits,* vol. 28, No. 12, Dec. 1993, pp. 1200–1206.

Marble, William J., et al. "A Differential Charge Transfer Amplifier for Low–Power Sensing and Instrumentation" *IEEE Custom Integrated Circuits Conference*, May 2000, In Review.

McCreary, James L., et al. "All–MOS Charge Redistribution Analog–to–Digital Conversion Techniques—Part I" *IEEE Journal of Solid–State Circuits,* vol. SC–10, No. 6, Dec. 1975, pp. 371–379.

Ploeg, Hendrik van der. "A 3.3–V, 10–b, 25–MSample/s Two–Step ADC in 0.35–$\mu$m CMOS" *IEEE Journal of Solid–State Circuits,* vol. 34, No. 12, Dec. 1999, pp. 1803–1811.

Shieh, Je–Hurn, et al. "Measurement and Analysis of Charge Injection in MOS Analog Switches" *IEEE Journal of Solid–State Circuits,* vol. SC–22, No. 2, Apr. 1987, pp. 277–281.

Tsukude, Masaki, et al., "A 1.2 to 3.3–V Wide Voltage–Range/Low–Power DRAM with a Charge–Transfer Presensing Scheme" *IEEE Journal of Solid–State Circuits,* vol. 32, No. 11, Nov. 1997, pp. 1721–1727.

* cited by examiner

DIFFERENTIAL-MODE CHARGE TRANSFER AMPLIFIER

BACKGROUND OF THE INVENTION

1. The Field of the Invention

The present invention relates to systems and methods for amplifying electrical signals. More specifically, the present invention relates to systems and methods for performing amplification by charge transfer.

2. The Prior State of the Art

There are many circuits and methods conventionally available for amplifying an electrical signal. One type of amplifier is called a charge transfer amplifier. Charge transfer amplifiers operate on the principle of capacitive charge sharing. Voltage amplification is achieved by transferring a specific amount of charge between appropriately sized capacitors through an active device.

FIG. 1 illustrates a charge transfer amplifier 100 that utilizes an nMOS transistor N1 to transfer charge between capacitors CT and CO. The operation of the nMOS charge transfer amplifier 100 will now be described in order to illustrate the basic principle of charge transfer amplification.

The nMOS charge transfer amplifier 100 operates in a cycle of three phases including a reset phase, a precharge phase, and an amplify phase. FIG. 2 is a signal timing diagram for two input signals $S_1$ and $S_2$ with respect to the cycle phase that the nMOS charge transfer amplifier 100 is operating in whether that phase be (a) the reset phase, (b) the precharge phase or (c) the amplify phase. The two input signals $S_1$ and $S_2$ control corresponding switches S1 and S2 of FIG. 1.

The cycle begins with the (a) reset phase in which the signal $S_1$ is high indicating that the switch S1 is closed, and in which the signal $S_2$ is low indicating that the switch S2 is open. Since the switch S1 is closed, the upper terminal of capacitor CT (i.e., node A) is discharged through the switch S1 to voltage Vss while the switch S2 is open thus isolating the nMOS transistor N1 as well as node B and the upper terminal of capacitor CO from the precharge voltage $V_{PR}$ thereby preventing static current flow through the nMOS transistor N1.

After the reset phase is the (b) precharge phase in which the signal $S_1$ is low indicating that switch S1 is open, and in which the signal $S_2$ is high indicating that the switch S2 is closed. Thus, the upper terminal of the capacitor CO (i.e., node B) is charged to the precharge voltage $V_{PR}$. This precharge voltage $V_{PR}$ is high enough that current flows from node B to the capacitor CT (and node A) through the nMOS transistor N1. For example, if the precharge voltage $V_{PR}$ is at least equal to the input voltage $V_{IN}$ at the gate of the nMOS transistor N1, then the discharge continues until the voltage at the capacitor CT increases to be equal to the input voltage $V_{IN}$ minus the threshold voltage (hereinafter "$V_{TN}$") of the nMOS transistor N1. At that point, the nMOS transistor N1 enters the cutoff region and current flow to the capacitor $C_T$ substantially ceases. Thus, at the end of the precharge phase, the capacitor CO ideally has a voltage of $V_{PR}$ while the capacitor CT has a voltage of $V_{PR}-V_{TN}$.

After the precharge phase is the (c) amplify phase in which both signals $S_1$ and $S_2$ are low indicating that both switches S1 and S2 are open. During the amplify phase, an incrementally positive input voltage change $\Delta V_{IN}$ at the gate of the nMOS transistor N1 will cause the nMOS transistor N1 to turn on thereby allowing current to flow through the nMOS transistor N1 until the nMOS transistor is again cutoff. For small incrementally positive voltage changes $\Delta V_{IN}$, the nMOS transistor N1 will cutoff when the voltage on upper terminal of the capacitor CT (i.e., node A) increases by the incrementally positive voltage change $\Delta V_{IN}$. The amount of charge transferred to the capacitor CT in order to produce this effect is equal to the incrementally positive voltage change $\Delta V_{IN}$ times the capacitance $C_T$ of the capacitor CT.

Since the charge $\Delta V_{IN} \times C_T$ transferred to the capacitor CT came from node B through transistor N1, the charge $\Delta V_{IN} \times C_T$ was drawn from the capacitor CO. Thus, the voltage at the capacitor CO and the output voltage $V_{OUT}$ will change by $\Delta V_{IN} \times (C_T/C_O)$. If the capacitance $C_T$ is greater than the capacitance $C_O$, amplification occurs.

One advantage of the nMOS charge transfer amplifier 100 is that the voltage gain and power consumption may be controlled by setting the capacitance of the capacitors CO and CT as well as by setting the capacitance ratio $C_T/C_O$.

Another advantage of charge transfer amplifiers in general is that the circuit performance is generally unaffected by the absolute values of the supply voltage Vss and Vdd as long as these voltages permit proper biasing during the reset and precharge phases. In other words, charge transfer amplifiers have high supply voltage scalability in that no changes are needed for a charge transfer amplifier to operate using a wide range of supply voltages Vss and Vdd.

Although the nMOS charge transfer amplifier 100 has these advantages, there are at least two disadvantages to amplifying using the nMOS charge transfer amplifier 100.

First, amplification only occurs if the input gate voltage change $\Delta V_{IN}$ is positive. A negative gate voltage change $\Delta V_{IN}$ would only cause the nMOS transistor N1 to enter deeper into the cutoff region. Thus, charge transfer between node A and node B would be stifled thereby preventing amplification.

Second, leakage currents inherent in transistor N1 will alter the expected zero-bias (i.e., no input signal) conditions on capacitors CT and CO during the amplify phase. This leakage current may be caused by current undesirably leaking from the source/drain diffusion regions of the nMOS transistor N1 into the substrate in which they are formed. Leakage current may also be caused by current flowing between the source and drain terminals of the nMOS transistor N1 even though the nMOS transistor N1 is substantially cutoff. Either way, this leakage current effectively produces a voltage error $V_{ERROR}$ at the output terminal that introduces amplification error. The voltage error $V_{ERROR}$ becomes very large over time and is highly affected by temperature conditions. Instead of ideally producing a proportionally amplified output voltage $V_{OUT}$ according to the formula $V_{OUT} = \Delta V_{IN} \times (C_T/C_O)$, the amplifier would produce an output voltage $V_{OUT}$ with an error factor according to the formula $V_{OUT} = \Delta V_{IN} \times (C_T/C_O) - V_{ERROR}$.

FIG. 3 shows a conventional CMOS charge transfer amplifier 300 that substantially overcomes the above-described limitations of the nMOS charge transfer amplifier 100. The CMOS charge transfer amplifier 300 includes the nMOS charge transfer amplifier 100 described above. For clarity, the nMOS charge transfer amplifier 100 is shown in FIG. 3 as being enclosed by a dotted box. The CMOS charge transfer amplifier 300 also includes a partially overlapping pMOS charge transfer amplifier 301 which is shown in FIG. 3 enclosed by a dashed box for clarity. The pMOS charge transfer amplifier 301 shares the voltage input line 302, the voltage output line 303 and the precharge line 304 with the nMOS charge transfer amplifier 100. The pMOS charge transfer amplifier 301 is structured similar to the nMOS charge transfer amplifier 100 except that the pMOS charge transfer amplifier 301 uses a pMOS transistor P1 instead of an nMOS transistor N1 for transferring charge between capacitors. Also, node A' of the pMOS charge transfer amplifier 301 is reset to a high voltage Vdd instead of the low voltage Vss and is capacitively coupled to the high voltage Vdd instead of the low voltage Vss.

The general operation of the pMOS charge transfer amplifier 301 for negative input voltage changes $\Delta V_{IN}$ is similar to the operation of the nMOS charge transfer amplifier 100 for positive voltage changes $\Delta V_{IN}$. Thus, the input signals $S_1$ and $S_2$ of FIG. 2 are used in the operation of the CMOS charge transfer amplifier 300. Due to the complementary nature of the nMOS charge transfer amplifier 100 and the pMOS charge transfer amplifier 301, the CMOS charge transfer amplifier 300 amplifies for both positive and negative input voltage changes $\Delta V_{IN}$ thereby overcoming one of the two described limitations of the nMOS charge transfer amplifier 100. Furthermore, the offset voltage $V_{OFFSET}$ may be minimized by sizing the nMOS transistor N1 and the pMOS transistor P1 so that the leakage currents match closely. While the match is never perfect or even predictable, the overall voltage error is usually lowered relative to the voltage error of the nMOS charge transfer amplifier 100 alone.

While the voltage error is improved by the addition of a complementary pMOS charge transfer amplifier 301 to the nMOS charge transfer amplifier 100, the voltage error is still too large to permit use with precision applications. This is due to the difficulty in sizing the transistors N1 and P1 to match leakage currents and due to the different rates of leakage current fluctuation in nMOS and pMOS transistors with changes in ambient temperature and sampling frequency. Recent constructions of the CMOS charge transfer amplifier 300 have shown voltage error of several millivolts depending on the ambient temperature and the clock speed.

As an additional disadvantage, the CMOS charge transfer amplifier 300 is single-ended and thus suffers from high common-mode noise. Common-mode noise is the amount of effect caused at the output terminal by the voltages at the input terminals changing together.

It would, therefore, represent an advancement in the art to create a charge transfer amplifier in which the offset voltage due to leakage current is reduced and in which common-mode rejection is increased. It would represent yet a further advancement in the art if such a configuration maintained the appeal of low power operation and accurate gain control in the presence of device parameter and temperature variations. It would represent yet a further advancement in the art if such a configuration maintained the appeal of high supply voltage scalability.

SUMMARY AND OBJECTS OF THE INVENTION

The foregoing problems in the prior state of the art have been successfully overcome by the present invention, which is directed to a differential-mode charge transfer amplifier. The differential-mode charge transfer amplifier receives a differential input voltage and produces a differential output voltage that is substantially proportional to the differential input voltage. The present invention may be used, for example, in the preamplifier stage coupling to a dynamic latch to form an efficient voltage comparator. However, the present invention is robust enough to be used in any application where high precision differential-mode amplification is desired.

The differential-mode charge transfer amplifier includes two CMOS charge transfer amplifiers. CMOS charge transfer amplifiers typically each include two charge transfer capacitors, one for capacitively coupling to a high voltage source, and one for capacitively coupling to a low voltage source. In the present invention, the two CMOS charge transfer amplifiers share two charge transfer capacitors such that the CMOS charge transfer amplifiers are mirrored about the capacitors. For example, the positive charge transfer capacitor terminal (i.e., the terminal that is precharged to a high voltage) of one CMOS charge transfer amplifier is capacitively coupled to the negative charge transfer capacitor terminal (i.e., the terminal that is precharged to a low voltage) of the other CMOS charge transfer amplifier. In addition, the negative charge transfer capacitor terminal of one CMOS charge transfer amplifier is capacitively coupled to the positive terminal of the other CMOS charge transfer amplifier.

The differential-mode charge transfer amplifier operates cyclically with each cycle having three phases; a reset phase, a precharge phase, and an amplify phase. The cycle begins with the reset phase in which a low voltage is applied to the negative charge transfer capacitor terminals of each of the CMOS charge transfer amplifiers. Furthermore, a high voltage is asserted at the positive charge transfer capacitor terminal of each of the CMOS charge transfer amplifiers. The low voltage (and the high voltage) should be sufficiently low (and high) such that memory is prevented from one cycle to the next.

In the precharge phase, a precharge voltage is asserted at both output terminals. The precharge voltage should be sufficient such that current flows from the positive charge transfer capacitor terminal, through the corresponding pMOS transistor to the corresponding output terminal, and such that current flows from each output terminal through a corresponding nMOS transistor to a corresponding negative charge transfer capacitor terminal.

During amplification, a differential input voltage is applied between the input terminals. This causes a differential output voltage to be produced between the output terminals as described in the following detailed description.

The present invention has several advantages in addition to providing good differential voltage gain. The differential-mode charge transfer amplifier also has large common-mode rejection since like devices (e.g., nMOS transistors, pMOS transistors, switches, capacitors, and so forth) from one CMOS charge transfer amplifier are differentially matched to like devices from the other CMOS charge transfer amplifier.

Furthermore, the amplifier has a significantly reduced voltage error for a wide range of ambient temperatures. This is accomplished since like devices typically have similar leakage current characteristics at a given temperature. Since like devices of one CMOS charge transfer amplifier are differentially matched to like devices of the other CMOS charge transfer amplifier, the leakage currents substantially cancel out.

While the differential-mode charge transfer amplifier eliminates a significant dependence upon exact MOSFET device parameters such as threshold voltage, matching parameters may play an important role in the performance at high speeds where the MOSFET transistors may not enter the cutoff region during the precharge phase before amplification begins. Thus, for high-speed applications, the MOSFET device parameters of a device should closely match that of the correspondingly matched device.

An additional advantage of the present invention arises out of the special connections of the charge transfer capacitors dynamically coupling signals of interest between amplifier signal paths. Accordingly, the charge transfer operation is now essentially processed by two charge transfer amplifiers. This parallel signal path speeds up the charge transfer process and therefore allows faster sampling rates without a loss in gain or accuracy.

The differential-mode charge amplifier is much different that two CMOS charge transfer amplifiers running independently, but in parallel. In parallel CMOS charge amplifiers, one input terminal from each CMOS charge transfer amplifier would comprise the two differential input terminals and one output terminal from each CMOS charge transfer amplifier would comprise the two differential output terminals. In all other respects, the CMOS charge transfer amplifiers would run independently. In contrast, the differential-mode charge transfer amplifier of the present invention utilizes two modified CMOS charge transfer amplifiers that interact with each other.

An advantage of the differential-mode charge transfer amplifier over the CMOS charge transfer amplifier, or even a pair of independently running parallel CMOS charge transfer amplifiers, is an increased range of input linearity due to its enhanced differential mode operation. Rather than produce a wide voltage swing at one output terminal in response to an input signal, the differential-mode charge transfer amplifier shares the voltage swing approximately half and half between the two output terminals. This gives the differential-mode charge transfer amplifier a significant advantage as a discrete-time analog signal amplifier.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The invention is described below by using diagrams to illustrate either the structure or processing of embodiments used to implement the circuits and methods of the present invention. Using the diagrams in this manner to present the invention should not be construed as limiting of the scope of the invention. A specific embodiment is described below in order to facilitate an understanding of the general principles of the present invention. Various modifications and variations will be apparent to one skilled in the art after having reviewed this disclosure.

Figure 4:
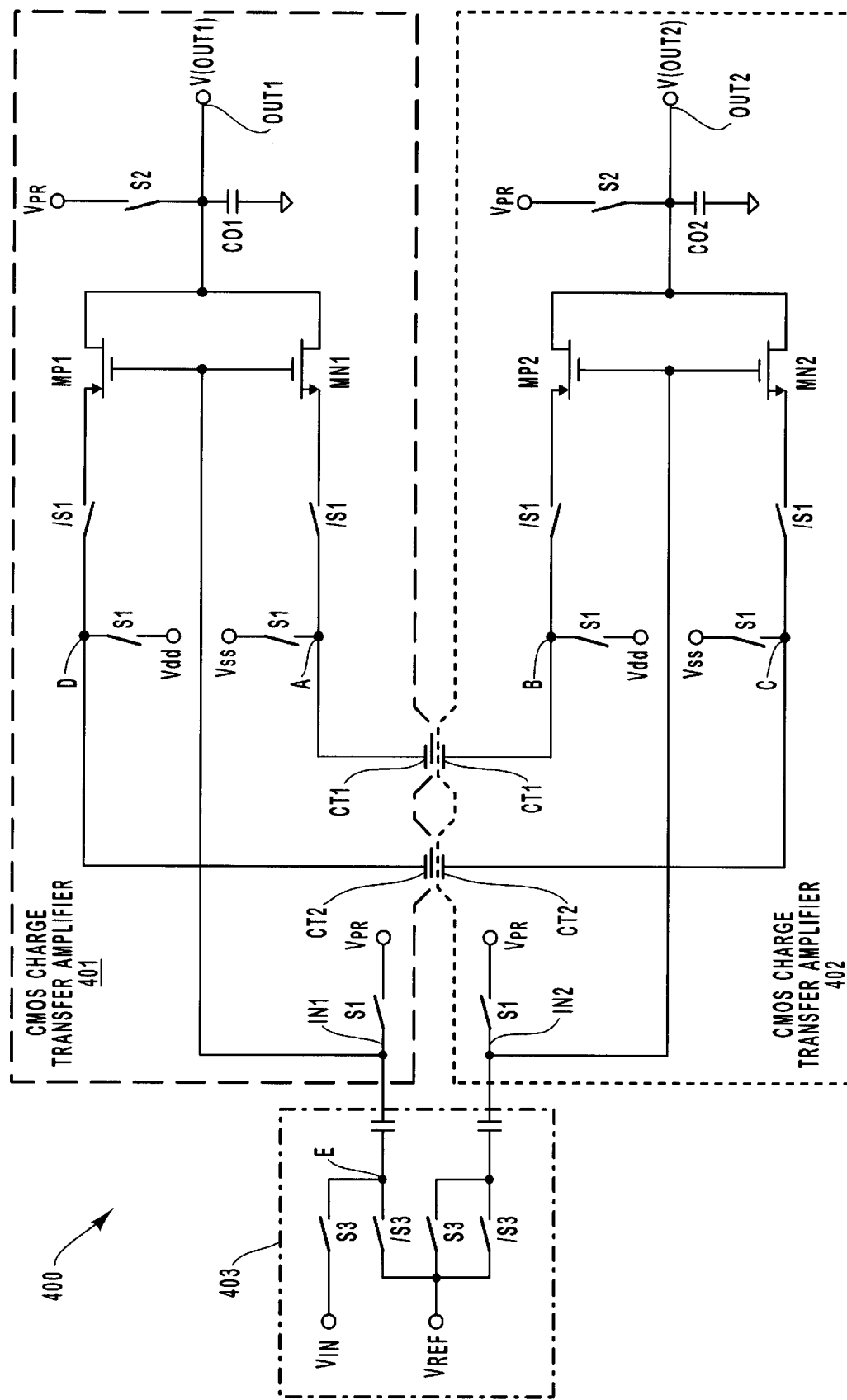
FIG. 4 is a circuit diagram of a differential-mode charge transfer amplifier in accordance with the present invention.

FIG. 4 illustrates a differential-mode charge transfer amplifier 400 in accordance with the present invention. The structure of FIG. 4 represents one example of a means for producing an output differential voltage. The differential-mode charge transfer amplifier 400 includes two mirrored CMOS charge transfer amplifiers. One CMOS charge transfer amplifier 401 is represented by the circuitry within the dashed box, and the other CMOS charge transfer amplifier 402 is represented by the circuitry within the dotted box. Optionally, the differential-mode charge transfer amplifier 400 includes a means for applying a differential voltage between first and second input terminals. This means is illustrated by the circuitry within the half-dotted and half-dashed box 403.

Figure 1:
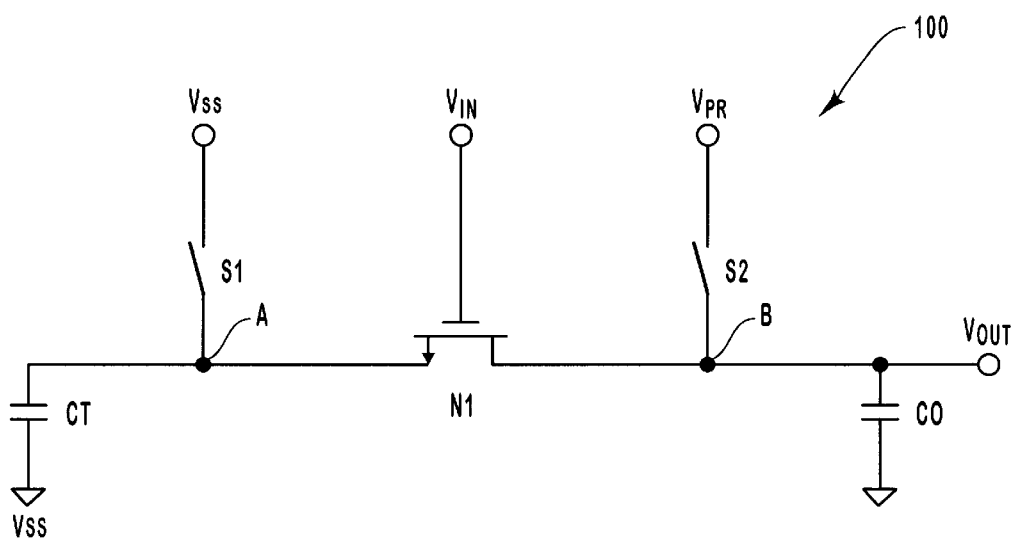
FIG. 1 is a circuit diagram of a conventional nMOS charge transfer amplifier.
Figure 2:
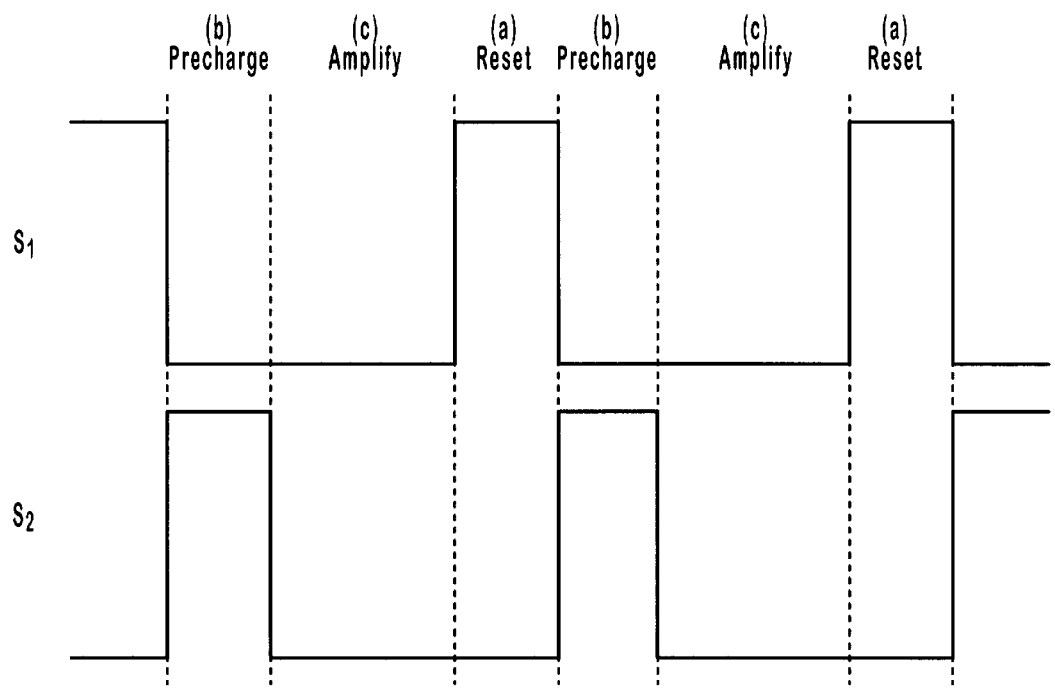
FIG. 2 is a timing diagram of several waveforms used to operate switches S1 and S2 in order to properly operate the nMOS charge transfer amplifier of FIG. 1, and the CMOS charge transfer amplifier of FIG. 3.
Figure 3:
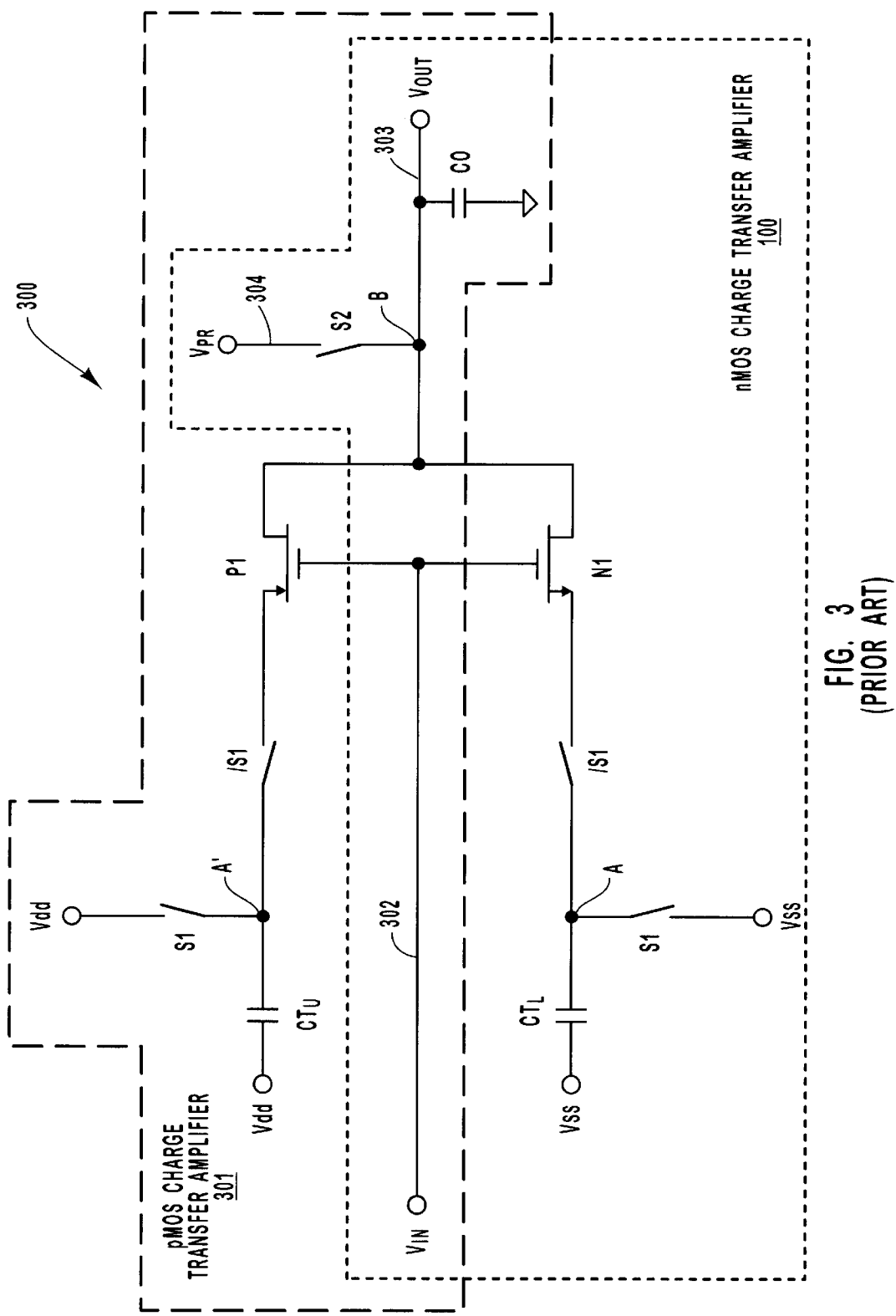
FIG. 3 is a circuit diagram of a conventional CMOS charge transfer amplifier.

The CMOS charge transfer amplifiers 401 and 402 are each electrically structured similar to the CMOS charge transfer amplifier 300 shown in FIG. 3. Specifically, each CMOS charge transfer amplifier includes an input terminal that is electrically connected to the gate of an nMOS and pMOS transistor as illustrated in FIG. 3. For example, the CMOS charge transfer amplifier 401 includes an input terminal IN1 (hereinafter, "the first input terminal") that is electrically connected to the gates of both the nMOS transistor MN1 and the pMOS transistor MP1. Similarly, the CMOS charge transfer amplifier 402 includes an input terminal IN2 (hereinafter, "the second input terminal") that is electrically connected to the gates of both the nMOS transistor MN2 and the pMOS transistor MP2.

Furthermore, each CMOS charge transfer amplifier has an output terminal electrically coupled to a source or drain terminal of a corresponding nMOS and pMOS transistor as illustrated in FIG. 3. For example, the CMOS charge transfer amplifier 401 has an output terminal OUT1 (hereinafter, "the first output terminal") connected to the source or drain terminal of nMOS transistor MN1 and pMOS transistor MP1. The CMOS charge transfer amplifier 402 has an output terminal OUT2 (hereinafter, "the second output terminal") connected to the source or drain terminal of nMOS transistor MN2 and pMOS transistor MP2.

The output terminal of each of the CMOS charge transfer amplifiers are also capacitively coupled to a fixed voltage such as ground as shown in FIG. 3. For example, the first output terminal OUT1 is coupled through a capacitor CO1 (hereinafter, "the first output capacitor") to a fixed voltage such as ground. The second output terminal OUT2 is coupled through a capacitor CO2 (hereinafter, "the second output capacitor") to a fixed voltage such as ground. Those skilled in the art will recognize after reviewing this disclosure that the amplifier 400 will operate with the output terminals capacitively coupled through the capacitors CO1 and CO2 to any fixed voltage.

Each CMOS charge transfer amplifier includes a "positive" terminal (i.e., node A' of FIG. 3) of a charge transfer capacitor that is coupled through a switch S1 to a voltage source Vdd, and through a switch /S1 to the source or drain terminal of a pMOS transistor that is opposite the output terminal. A "positive" terminal of the charge transfer capacitor is defined as the terminal that is couplable through the switch S1 to the voltage source Vdd. For example, the CMOS charge transfer amplifier 401 includes a positive terminal (i.e., node D) of the charge transfer capacitor CT2 that is couplable to the voltage source Vdd through the switch S1. The other CMOS charge transfer amplifier 402 includes a positive terminal (i.e., node B) of a charge transfer amplifier CT1 that is couplable to the voltage source Vdd through the switch S1.

Each CMOS charge transfer amplifier also includes a "negative" terminal (i.e., node A in FIG. 3) that is couplable to a voltage source Vss through a switch S1. A "negative" terminal of the charge transfer capacitor means the terminal that is couplable through the switch S1 to the voltage source Vss. For example, the CMOS charge transfer amplifier 401 includes a negative terminal (i.e., node A) of the charge transfer capacitor CT1 that is couplable to the voltage source Vss through the switch S1. The other CMOS charge transfer amplifier 402 includes a negative terminal (i.e., node C) of the charge transfer capacitor CT2 that is couplable to the voltage source Vss through the switch S1.

Although each CMOS charge transfer amplifier 401 and 402 are somewhat similar to the CMOS charge transfer amplifier 300 of FIG. 3 in the details described above, they have significant differences from the CMOS charge transfer amplifier 300. For example, in FIG. 3, the positive terminal (i.e., node A') of the upper charge transfer capacitor $CT_U$ is capacitively coupled through the upper charge transfer capacitor $CT_U$ to the high voltage source Vdd. Similarly, the negative terminal (i.e., node A) of the lower charge transfer capacitor $CT_L$ is capacitively coupled through the lower charge transfer capacitor $CT_L$ to the low voltage source Vss.

This is significantly different than the CMOS charge transfer amplifiers 401 and 402 of FIG. 4. Specifically, the CMOS charge transfer amplifier 401 has a positive charge transfer capacitor terminal (i.e., node D) that is capacitively coupled through the charge transfer capacitor CT2 not to the voltage source Vdd as in FIG. 3, but to the negative charge transfer capacitor terminal (i.e., node C) of the other CMOS charge transfer amplifier 402. Furthermore, the CMOS charge transfer amplifier 401 has a negative charge transfer capacitor terminal (i.e., node A) that is capacitively coupled through the charge transfer capacitor CT1 not to the voltage source Vss as in FIG. 3, but to the positive terminal (i.e., node B) of the other CMOS charge transfer amplifier 402. This significant difference produces new and surprising results as is demonstrated by the following description of the operation of the differential-mode charge transfer amplifier 400.

Figure 5:
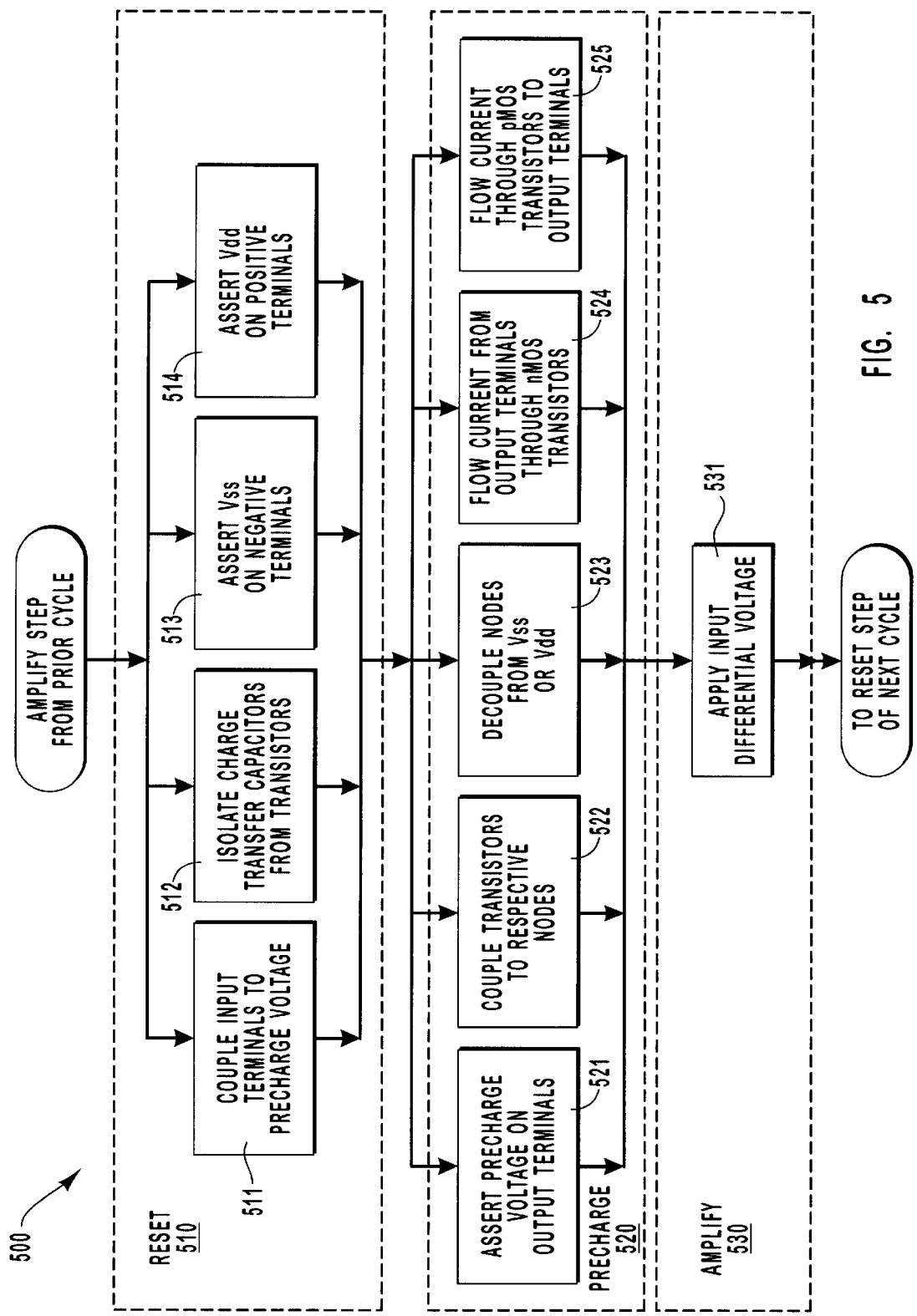
FIG. 5 is a flowchart showing the overall operation of the differential-mode charge transfer amplifier.
Figure 6:
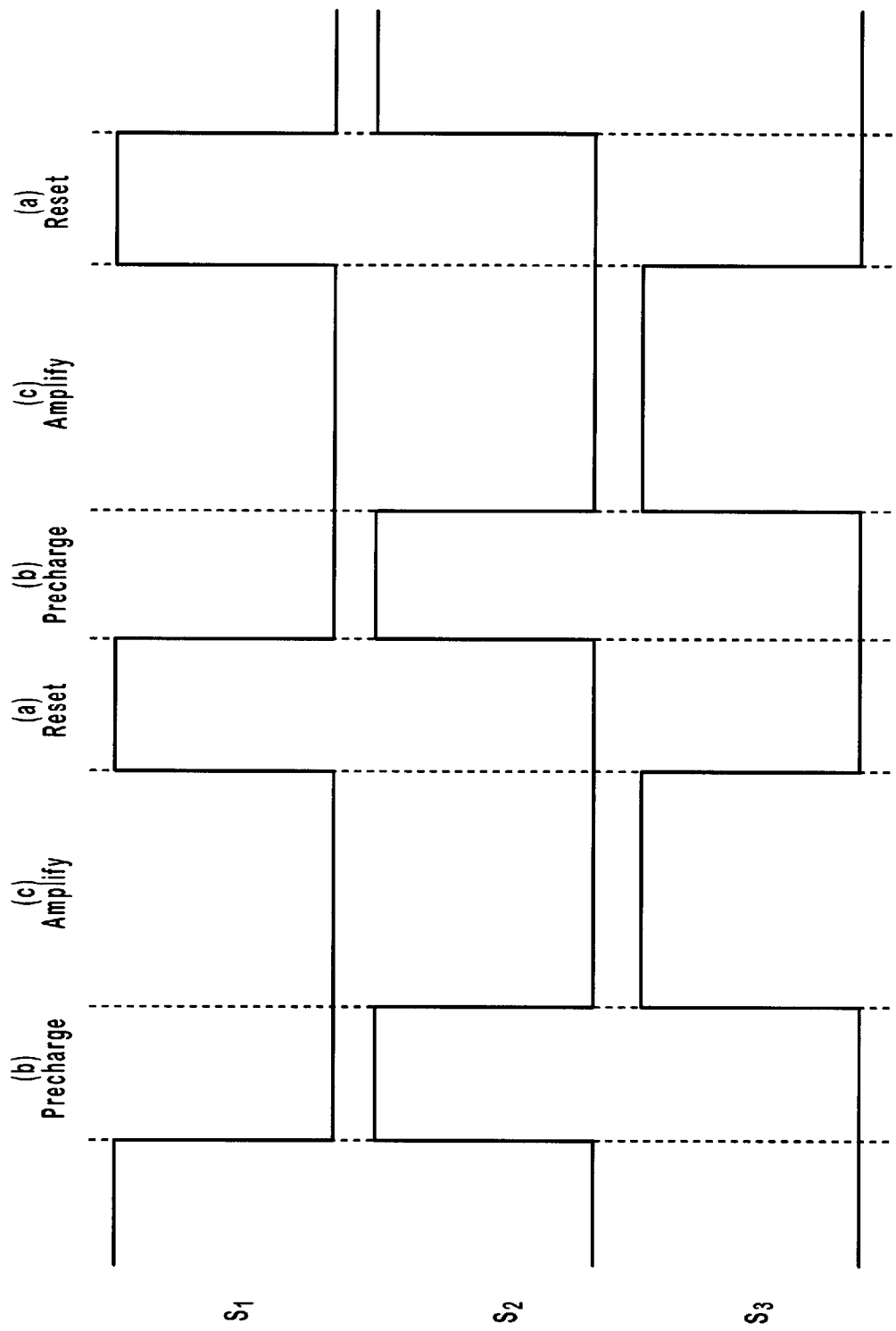
FIG. 6 is a timing diagram of several waveforms used to operate switches S1, S2 and S3 in order to properly operate the differential-mode charge transfer amplifier in accordance with the present invention.

FIG. 5 is a flowchart of the overall operation of the amplifier 400. The amplifier 400 operates in a cycle 500 that includes a reset step 510, a precharge step 520, and an amplify step 530. Each phase is implemented by the manipulation of the switches S1, S2, S3, /S1 and /S3. FIG. 6 illustrates several timing signals $S_1$, $S_2$ and $S_3$ used to operate corresponding switches S1, S2 and S3 in order to implement (a) the reset step, (b) the precharge step, and (c) the amplify step of FIG. 5. A high input signal $S_1$, $S_2$ or $S_3$ indicates that the corresponding switch S1, S2 or S3 is closed, and a low input signal $S_1$, $S_2$ or $S_3$ indicates that the corresponding switch S1, S2 or S3 is open. Furthermore, switch /S1 is open if switch S1 is closed, and vice versa. Switch /S3 is open if switch S3 is closed, and vice versa.

In the reset step 510, the first and second CMOS charge transfer amplifiers 401 and 402 are reset. Specifically, the switches of FIG. 4 have the configuration defined in Table 1.

TABLE 1

| Switch | Status |
|--------|--------|
| S1     | Closed |
| /S1    | Open   |
| S2     | Open   |
| S3     | Open   |
| /S3    | Closed |

With these settings, the first input terminal IN1 and the second input terminal IN2 are coupled to a precharge voltage $V_{PR}$ (act 511). The terminals of the charge transfer capacitors (i.e., nodes A, B, C, and D) are isolated from transistors MN1, MP2, MN2 and MP1, respectively, (act 512) thus preventing static current flow in or through these transistors. The isolation of node A, B, C, and D from the transistors during the reset phase improves the performance of the amplifier 400, but is not essential for the operation of the amplifier 400.

A low voltage of Vss is applied to the negative terminals (i.e., nodes A and C) of each charge transfer capacitor CT1 and CT2 (act 513) and a high voltage of Vdd is applied to the positive terminals (i.e., nodes B and D) of each charge transfer capacitor CT1 and CT2 (act 514). The low voltage Vss should be sufficiently low and the high voltage Vdd should be sufficiently high so as to prevent memory from carrying over from the amplify step of the previous cycle.

Figure 7:
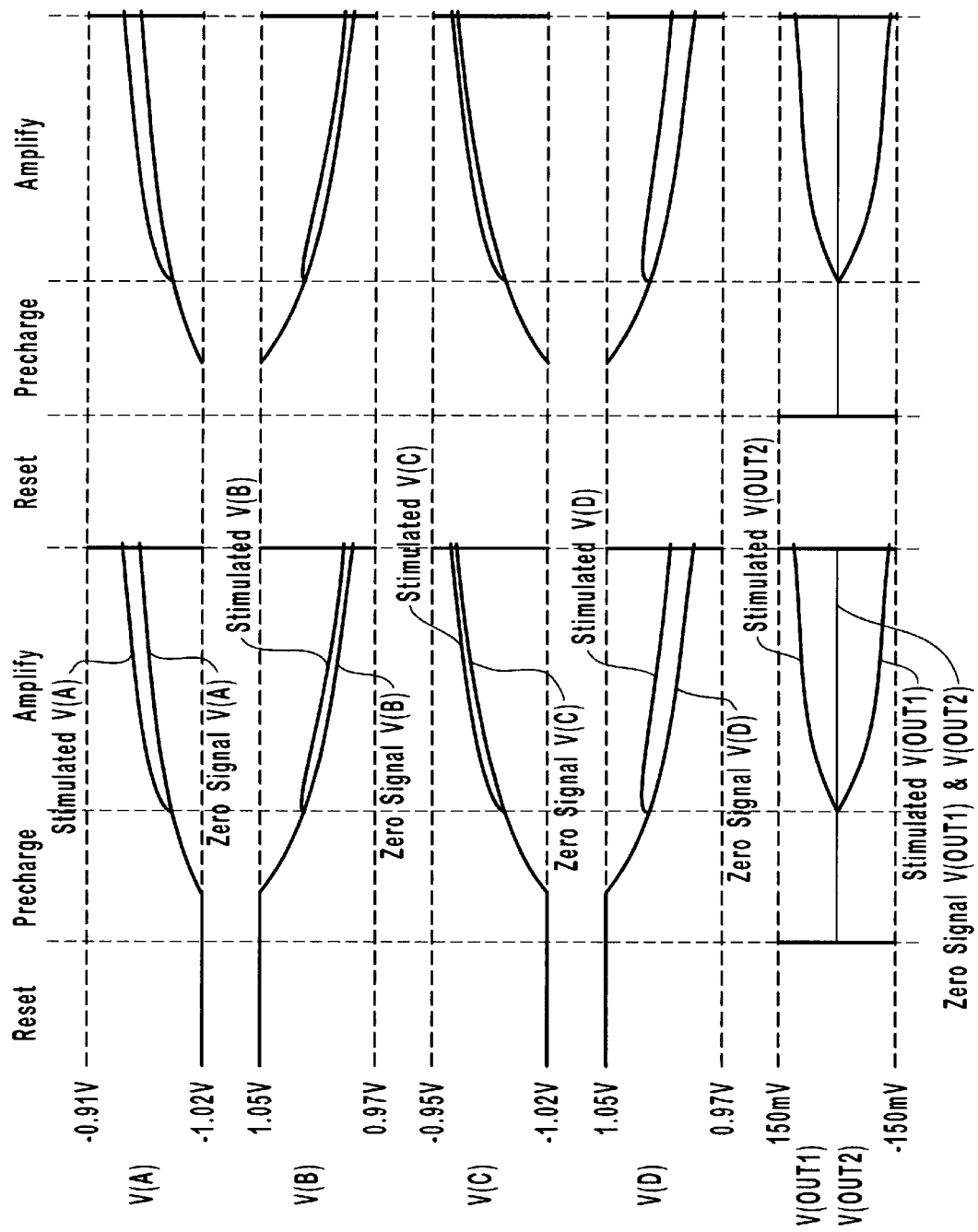
FIG. 7 is a timing diagram of several waveforms showing voltage states at various nodes of the differential-mode charge transfer amplifier during operation.

FIG. 7 illustrates waveforms showing the voltage states at node A, node B, node C, node D, the first output terminal OUT1, and the second output terminal OUT2. These waveforms are shown with respect to (a) the reset step 510, (b) the precharge step 520 and (c) the amplify step 530.

In the precharge step 520, the first and second CMOS charge transfer amplifiers are precharged. Specifically, the switches of FIG. 4 have the configuration defined in Table 2.

TABLE 2

| Switch | Status |
|--------|--------|
| S1     | Open   |
| /S1    | Closed |
| S2     | Closed |
| S3     | Open   |
| /S3    | Closed |

During the precharge step 520, since the switch S2 is closed, the precharge voltage $V_{PR}$ is asserted at the first output terminal OUT1 and at the second output terminal OUT2 (act 521). Also, switch /S1 is closed coupling the transistors MN1, MP2, MN2 and MP1 to nodes A, B, C and D, respectively (act 522). The switch S1 is opened thereby decoupling nodes A, B, C and D from their respective reset voltages Vss or Vdd (act 523).

The precharge voltage $V_{PR}$ should be sufficient to precharge the first and second CMOS charge transfer amplifiers. In other words, the precharge voltage $V_{PR}$ should be sufficiently high such that current passes from the output terminals OUT1 and OUT2 through the corresponding nMOS transistors MN1 and MN2 to the corresponding nodes A and C. Furthermore, the precharge voltage $V_{PR}$ should be sufficiently low such that current passes from the nodes B and D through the corresponding pMOS transistors MP2 and MP1 to the corresponding output terminals OUT2 and OUT1.

With the application of the precharge voltage $V_{PR}$ to the output terminals OUT1 and OUT2 and also the gates of the transistors MN1, MP2, MN2 and MP1, current flows from the output terminals OUT1 and OUT2 through the corresponding nMOS transistors MN1 and MN2 to the corresponding nodes A and C until the corresponding nMOS transistors are cutoff or substantially cutoff (act 524). In addition, current flows from the nodes B and D through the corresponding pMOS transistors MP2 and MP1 to the corresponding output terminals OUT2 and OUT1 (act 525).

As illustrated in FIG. 7, during the precharge step, current flows from the output terminals to nodes A and C causing voltage at nodes A and C to rise, while current flow from nodes B and D to the corresponding output terminals OUT2 and OUT1 causing the voltage at nodes B and D to drop.

In the amplify step 530, the first and second CMOS charge transfer amplifiers 401 and 402 are used to perform amplification. Specifically, the switches of FIG. 4 have the configuration defined in Table 3.

TABLE 3

| Switch | Status |
| --- | --- |
| S1 | Open |
| /S1 | Closed |
| S2 | Open |
| S3 | Closed |
| /S3 | Open |

The decoupling of the input terminals IN1 and IN2 from the precharge voltage $V_{PR}$ allows the input terminals IN1 and IN2 to float. In addition, the closing of the switch S3 allows for the operation of the means 403 for applying a differential voltage $\Delta V_{IN}$ between the input terminals IN1 and IN2. Specifically, the closing of the switch S3 means that the voltage at node E will increase from $V_{REF}$ to $V_{IN}$. A portion $K_1$, where $K_1$ is a constant less than 100%, of the voltage difference $(V_{IN}-V_{REF})$ will then pass though the capacitor to the input terminal IN1. This causes the differential input voltage $\Delta V_{IN}$ to be applied between the first input terminal IN1 and the second input terminal IN2 (act 531). The differential voltage $\Delta V_{IN}$ applied between input terminal IN1 and the input terminal IN2 would thus be $K_1(V_{IN}-V_{REF})$.

The case where $\Delta V_{IN}$ is positive is now described. In this case, the voltage at the gate terminal of nMOS transistor MN1 (and pMOS transistor MP1) increases by $\Delta V_{IN}$. This gate voltage increase causes current to flow from the first output terminal OUT1 to node A until the voltage at node A increases by an amount substantially equal to the gate voltage change $\Delta V_{IN}$. This effect may be seen by comparing the stimulated voltage of V(A) verses the zero-signal V(A) shown in FIG. 7. Since charge flows from the first output terminal OUT1, the voltage at the output terminal drops. This effect may be seen in FIG. 7 by comparing the drop of the stimulated V(OUT1) compared to the zero-signal V(OUT1).

Since the voltage at node A increases by $\Delta V_{IN}$, the voltage at node B also would tend to increase due to the capacitive coupling of node A and node B though the charge transfer capacitor CT1. This causes current to flow from node B through pMOS transistor MP2 to the second output terminal OUT2 until the pMOS transistor MP2 again becomes cutoff as node B gradually returns back to its original zero-signal voltage. This effect may be seen in FIG. 7 by the stimulated V(B) beginning to increase relative to the zero-signal V(B) and then dropping back towards the zero-signal V(B).

The current flow from node B through pMOS transistor MP2 causes the voltage at the second output terminal OUT2 to rise as represented in FIG. 7 by the rise of the stimulated V(OUT2). The net result is that, in response to an input voltage differential of $\Delta V_{IN}$, the voltage at the first output terminal OUT1 decreases and the voltage at the second output terminal OUT2 increases such that the output differential voltage V(OUT2)–V(OUT1) equals the input differential voltage $\Delta V_{IN}$ times the total gain. The total gain is equal to the capacitance $C_{T1}$ of the first charge transfer capacitor CT1 divided by the capacitance $C_O$ of the output capacitors CO1 and CO2 times a sampling rate dependent constant a that can vary between the approximate ranges of 1.3 and 1.9 depending on the sampling rate. This assumes that the capacitance $C_{O1}$ of the first output capacitor CO1 equals the capacitance $C_{O2}$ of the second output capacitor CO2 so that $C_O=C_{O1}=C_{O2}$.

The case where $\Delta V_{IN}$ is negative is symmetric to the case described above where $\Delta V_{IN}$ is positive. Specifically, the voltage at the first input terminal IN1 would decrease thereby turning the pMOS transistor MP1 on to allow charge to transfer from node D to the first output terminal OUT1 until the voltage at node D drops by $\Delta V_{IN}$. This would cause the voltage at the first output terminal OUT1 to increase. The decreased voltage at node D would propagate through the charge transfer capacitor CT2 to node C. As the voltage at node C begins to drop, charge will be drawn through the nMOS transistor MN2 from the second output terminal OUT2 thereby decreasing the voltage at the second output terminal OUT2. Thus, when the voltage at IN1 increases, V(OUT1) decreases while V(OUT2) increases. Similarly, while the voltage at IN1 decreases, V(OUT1) increases while V(OUT2) decreases.

The differential-mode charge amplifier 400 has many advantages. One significant advantage is its increased range of linearity. A CMOS charge transfer amplifier such as amplifier 300 of FIG. 3 has a range of linearity in which an applied input voltage $V_{IN}$ will produce a proportional output voltage $V_{OUT}$ according to the formula $V_{OUT}=-V_{IN}(C_T/C_O)$, where $C_T$ is the capacitance of the charge transfer capacitor CT and where $C_O$ is the capacitance of the output capacitor CO.

Beyond this range of linearity, the output voltage will not be proportional to the input voltage, but will rather be saturated at a value determined by a number of charge transfer amplifier variables. When a positive input voltage is applied to the CMOS charge transfer amplifier, the nMOS transistor turns on and charge transfer commences with capacitor CT receiving charge from capacitor CO (see FIG. 3) until the nMOS transistor cuts off or the output terminal (i.e., the drain of the nMOS transistor) falls to a level at or near the voltage at the source of the nMOS transistor. Sufficiently large input signals will cause the output terminal voltage to decrease such that the source-drain voltage of the nMOS transistor is zero, at which point the charge transfer ceases and the output node is said to be saturated.

The differential-mode charge transfer amplifier 400 has a substantially increased range of linearity compared to the CMOS charge transfer amplifier 300 alone, or even compared to a pair of independent, parallel CMOS charge transfer amplifiers. In "independent, parallel CMOS charge amplifiers", one input terminal from each CMOS charge transfer amplifier would comprise the two differential input terminals and one output terminal from each CMOS charge transfer amplifier would comprise the two differential output terminals. In all other respects, the CMOS charge transfer amplifiers would run independently. The pair of independent, parallel CMOS charge transfer amplifiers would essentially have the same range of linearity as a single CMOS charge transfer amplifier.

In contrast, the differential-mode charge transfer amplifier 400 utilizes two modified CMOS charge transfer amplifiers that interact with each other as described above. The interaction between the two modified CMOS charge transfer amplifiers causes the increased range of linearity due to its enhanced differential-mode of operation. Rather that producing a wide voltage swing at one output terminal in response to an input signal, the differential-mode charge transfer amplifier produces voltage changes split approximately half and half between the two output terminals. This gives the differential-mode charge transfer amplifier 400 a significant advantage as a discrete-time analog signal amplifier.

In addition to having an increased range of linearity, the amplifier 400 also increases common-mode rejection due to the symmetry of the amplifier 400. Common mode rejection is amount of common mode noise rejected. Common mode noise is the undesired voltage change at the output terminals OUT1 and OUT2 caused by the voltage at both input terminals IN1 and IN2 changing together. For example, if the voltage at the both input terminals IN1 and IN2 increases by an identical amount, there is very little differential voltage change between the output terminal OUT1 and OUT2. Increased common-mode rejection is accomplished by maintaining a differential-mode signal path.

Furthermore, the voltage error $V_{ERROR}$ of the output voltage V(OUT2)–V(OUT1) is significantly reduced. In addition, voltage error fluctuations due to temperature variations are reduced because the devices at one output will track with, or vary with, the respective device at the other output. For example, nMOS transistor MN1 tracks nMOS transistor MN2, pMOS transistor MP1 tracks pMOS transistor MP2, and so on. Since devices are matched with like devices, the devices will experience similar leakage current characteristics for any given temperature condition. Thus, the effects of leakage current will be substantially offset compared to the situation where devices are matched to dissimilar devices as in FIG. 3 where nMOS transistor N1 is match with a pMOS transistor P1.

While the amplifier 400 eliminates a significant dependence upon exact MOSFET device parameters such as threshold voltage, matching parameters may play an important role in the performance at high speeds where transistors MN1, MN2, MP1 and MP2 may not enter the cutoff region before the amplify phase begins as is the case with FIG. 7. Thus, the offset voltage $V_{OFFSET}$ causing amplification inaccuracies will increase with sampling speed at a rate roughly proportional to the mismatch in device parameters. Thus, for high-speed applications, the nMOS transistor MN1 parameters should be made to match the nMOS transistor MN2 parameters, and the pMOS transistor MP1 parameters should be made to match the pMOS transistor MP2 parameters.

An additional advantage of the present invention arises out of the special connections of capacitors CT1 and CT2 dynamically coupling signals of interest between amplifier signal paths. Accordingly, the charge transfer operation is now essentially processed by two charge transfer amplifiers. This parallel signal path speeds up the charge transfer process and therefore allows faster sampling rates without a loss in gain or accuracy.

A practical application of the amplifier 400 is in the preamplifier stage coupling to a dynamic latch to form an efficient voltage comparator. The comparator would then be useful as a key building block for low-power analog-to-digital converter systems. The resulting analog to digital converter could achieve excellent precision due to the low voltage error and increased common-mode rejection of the amplifier 400. With a growing emphasis on mobile electronics, efficient and accurate converters are highly practical for a variety of application. This is just one practical application of the amplifier 400. The amplifier 400 may be used in any application where low-power, high-precision differential-mode amplification is desired.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A differential-mode charge transfer amplifier for producing a differential output voltage on first and second output terminals that is substantially proportional to a differential input voltage applied between first and second input terminals, the differential mode charge transfer amplifier comprising the following:

a first CMOS charge transfer amplifier having the first input terminal as an input terminal and having the first output terminal as an output terminal;

a second CMOS charge transfer amplifier having the second input terminal as an input terminal and having the second output terminal as an output terminal, wherein a negative charge transfer capacitor terminal of the first CMOS charge transfer amplifier is capacitively coupled through a first charge transfer capacitor to a positive charge transfer capacitor terminal of the second CMOS charge transfer amplifier, wherein a positive charge transfer capacitor terminal of the first CMOS charge transfer amplifier is capacitively coupled through a second charge transfer capacitor to a negative charge transfer capacitor terminal of the second CMOS charge transfer amplifier, wherein the differential-mode charge transfer amplifier further comprises:

a first nMOS transistor configured to transfer charge between the negative terminal of the first charge transfer capacitor and the first output terminal; and a second nMOS transistor configured to transfer charge between the negative terminal of the second charge transfer capacitor and the second output terminal.

2. The differential-mode charge transfer amplifier as recited in claim 1, wherein a parameter of the first nMOS transistor closely matches a parameter of the second nMOS transistor.

3. The differential-mode charge transfer amplifier as recited in claim 2, wherein the parameter includes a threshold voltage.

4. A differential-mode charge transfer amplifier for producing a differential output voltage on first and second output terminals that is substantially proportional to a differential input voltage applied between first and second input terminals, the differential mode charge transfer amplifier comprising the following:
   a first CMOS charge transfer amplifier having the first input terminal as an input terminal and having the first output terminal as an output terminal;
   a second CMOS charge transfer amplifier having the second input terminal as an input terminal and having the second output terminal as an output terminal,
   wherein a negative charge transfer capacitor terminal of the first CMOS charge transfer amplifier is capacitively coupled through a first charge transfer capacitor to a positive charge transfer capacitor terminal of the second CMOS charge transfer amplifier,
   wherein a positive charge transfer capacitor terminal of the first CMOS charge transfer amplifier is capacitively coupled through a second charge transfer capacitor to a negative charge transfer capacitor terminal of the second CMOS charge transfer amplifier, wherein the differential-mode charge transfer amplifier further comprises:
   a first pMOS transistor configured to transfer charge between the positive terminal of the second charge transfer capacitor and the first output terminal; and
   a second pMOS transistor configured to transfer charge between the positive terminal of the first charge transfer capacitor and the second output terminal.

5. The differential-mode charge transfer amplifier as recited in claim 4, wherein a parameter of the first pMOS transistor closely matches a parameter of the second pMOS transistor.

6. The differential-mode charge transfer amplifier as recited in claim 5, wherein the parameter includes a threshold voltage.

7. A differential-mode charge transfer amplifier, further comprising:
   first and second input terminals;
   first and second output terminals; and
   means for producing a differential output voltage between the first and second output terminals that is substantially proportional to a differential input voltage applied between the first and second input terminals, wherein the means for producing a differential output voltage comprises:
      a first CMOS charge transfer amplifier having the first input terminal as an input terminal and having the first output terminal as an output terminal; and
      a second CMOS charge transfer amplifier having the second input terminal as an input terminal and having the second output terminal as an output terminal,
   wherein a negative charge transfer capacitor terminal of the first CMOS charge transfer amplifier is capacitively coupled through a first charge transfer capacitor to a positive charge transfer capacitor terminal of the second CMOS charge transfer amplifier, and
   wherein a positive charge transfer capacitor terminal of the first CMOS charge transfer amplifier is capacitively coupled through a second charge transfer capacitor to a negative charge transfer capacitor terminal of the second CMOS charge transfer amplifier, wherein the differential-mode charge transfer amplifier further comprises:
      a first nMOS transistor configured to transfer charge between the negative terminal of the first charge transfer capacitor and the first output terminal; and
      a second nMOS transistor configured to transfer charge between the negative terminal of the second charge transfer capacitor and the second output terminal.

8. A differential-mode charge transfer amplifier, further comprising:
   first and second input terminals;
   first and second output terminals; and
   means for producing a differential output voltage between the first and second output terminals that is substantially proportional to a differential input voltage applied between the first and second input terminals, wherein the means for producing a differential output voltage comprises:
      a first CMOS charge transfer amplifier having the first input terminal as an input terminal and having the first output terminal as an output terminal; and
      a second CMOS charge transfer amplifier having the second input terminal as an input terminal and having the second output terminal as an output terminal,
   wherein a negative charge transfer capacitor terminal of the first CMOS charge transfer amplifier is capacitively coupled through a first charge transfer capacitor to a positive charge transfer capacitor terminal of the second CMOS charge transfer amplifier, and
   wherein a positive charge transfer capacitor terminal of the first CMOS charge transfer amplifier is capacitively coupled through a second charge transfer capacitor to a negative charge transfer capacitor terminal of the second CMOS charge transfer amplifier, wherein the differential-mode charge transfer amplifier further comprises:
      a first pMOS transistor configured to transfer charge between the positive terminal of the second charge transfer capacitor and the first output terminal; and
      a second pMOS transistor configured to transfer charge between the positive terminal of the first charge transfer capacitor and the second output terminal.

9. In a differential-mode charge transfer amplifier that includes first and second CMOS charge transfer amplifiers having first and second input terminals and first and second output terminals, respectively, wherein a positive charge transfer capacitor terminal of the first CMOS charge transfer amplifier is capacitively coupled to a negative charge transfer capacitor terminal of the second CMOS charge transfer amplifier, and wherein a negative charge transfer capacitor terminal of the first CMOS charge transfer amplifier is capacitively coupled to a positive charged transfer capacitor terminal of the second CMOS charge transfer amplifier, a method for producing a differential output voltage between the first and second output terminals that is substantially proportional to a differential input voltage applied between the first and second input terminals, the method comprising the following:
   during a reset phase, a specific act of asserting a low voltage at the negative charge transfer capacitor terminal of each of the first and second CMOS charge transfer amplifiers, wherein the low voltage is sufficiently low so as to prevent memory from one cycle to the next;
   during a reset phase, a specific act of asserting a high voltage at the positive charge transfer capacitor terminal of each of the first and second charge transfer amplifiers, wherein the high voltage is sufficiently high so as to prevent memory from one cycle to the next;

during a precharge phase, a specific act of asserting a precharge voltage at the first and second output terminals, the precharge voltage being sufficient to precharge the first and second charge transfer amplifiers, wherein the specific act of asserting a precharge voltage comprises the following:

a specific act of closing a switch between the positive charge transfer capacitor terminal of the first CMOS charge transfer amplifier and a first pMOS transistor configured to transfer charge between the positive charge transfer capacitor terminal of the first CMOS charge transfer amplifier and the first output terminal;

a specific act of closing a switch between the negative charge transfer capacitor terminal of the first CMOS charge transfer amplifier and a first nMOS transistor configured to transfer charge between the negative charge transfer capacitor terminal of the first CMOS charge transfer amplifier and the first output terminal;

a specific act of closing a switch between the positive charge transfer capacitor terminal of the second CMOS charge transfer amplifier and a second pMOS transistor configured to transfer charge between the positive charge transfer capacitor terminal of the second CMOS charge transfer amplifier and the second output terminal; and a specific act of closing a switch between the negative charge transfer capacitor terminal of the second CMOS charge transfer amplifier and a second nMOS transistor configured to transfer charge between the negative charge transfer capacitor terminal of the second CMOS charge transfer amplifier and the second output terminal; and during an amplify phase, a specific act of applying the differential input voltage between the first and second input terminals, wherein the differential output voltage is produced between the first and second output terminals.

10. The method as recited in claim 9, wherein the specific act of applying the differential input voltage is performed using a means for applying an input differential voltage.

11. In a differential-mode charge transfer amplifier that includes first and second CMOS charge transfer amplifiers having first and second input terminals and first and second output terminals, respectively, wherein a positive charge transfer capacitor terminal of the first CMOS charge transfer amplifier is capacitively coupled to a negative charge transfer capacitor terminal of the second CMOS charge transfer amplifier, and wherein a negative charge transfer capacitor terminal of the first CMOS charge transfer amplifier is capacitively coupled to a positive charged transfer capacitor terminal of the second CMOS charge transfer amplifier, a method for producing a differential output voltage between the first and second output terminals that is substantially proportional to a differential input voltage applied between the first and second input terminals, the method comprising the following:

a step for resetting the first and second CMOS charge transfer amplifiers, wherein the step for resetting comprises a specific act of asserting a low voltage at the negative charge transfer capacitor terminal of each of the first and second CMOS charge transfer amplifiers, wherein the low voltage is sufficiently low so as to prevent memory from one cycle to the next;

a step for precharging the first and second CMOS charge transfer amplifiers;

during an amplify phase, a specific act of applying the differential input voltage between the first and second input terminals, wherein the differential output voltage is produced between the first and second output terminals.

12. The method as recited in claim 11, wherein the step for resetting further comprises the following:

a specific act of asserting a high voltage at the positive charge transfer capacitor terminal of each of the first and second CMOS charge transfer amplifiers, wherein the high voltage is sufficiently high so as to prevent memory from one cycle to the next.

13. The method according to claim 11, wherein the step for precharging comprises the following:

a specific act of asserting a precharge voltage at the first and second output terminals, the precharge voltage being sufficient to precharge the first and second charge transfer amplifiers.

14. The method according to claim 11, wherein the step for amplifying comprises the following:

a specific act of applying the differential input voltage between the first and second input terminals, wherein the differential output voltage is produced between the first and second output terminals.

* * * * *

UNITED STATES PATENT AND TRADEMARK OFFICE
CERTIFICATE OF CORRECTION

PATENT NO. : 6,249,181 B1
DATED : June 19, 2001
INVENTOR(S) : William J. Marble

It is certified that error appears in the above-identified patent and that said Letters Patent is hereby corrected as shown below:

Column 9,
Line 20, before "voltage at nodes" insert -- the --
Line 23, after "OUT1" change "causing" to -- causes --
Line 46, after "pass" change "though" to -- through --

Column 10,
Line 1, after "node B" change "though" to -- through --
Line 21, after "constant" change "a" to -- α --

Signed and Sealed this

Seventh Day of May, 2002

Attest:

Attesting Officer

JAMES E. ROGAN
Director of the United States Patent and Trademark Office